(12) United States Patent
Morimoto

(10) Patent No.: US 7,503,180 B2
(45) Date of Patent: Mar. 17, 2009

(54) THERMOELECTRIC CONVERSION MODULE AND ELECTRONIC DEVICE

(75) Inventor: Akihiro Morimoto, Toyota (JP)

(73) Assignee: Aisin Seiki Kabushiki Kaisha, Kariya-shi (JP)

( * ) Notice: Subject to any disclaimer, the term of this patent is extended or adjusted under 35 U.S.C. 154(b) by 340 days.

(21) Appl. No.: 11/389,047

(22) Filed: Mar. 27, 2006

(65) Prior Publication Data
US 2006/0213204 A1    Sep. 28, 2006

(30) Foreign Application Priority Data
Mar. 25, 2005    (JP) .............................. 2005-090020

(51) Int. Cl.
*F25B 21/02*    (2006.01)
(52) U.S. Cl. .......................................... 62/3.7; 136/204
(58) Field of Classification Search ............. 62/3.1–3.7, 62/259.2; 136/204–212
See application file for complete search history.

(56) References Cited

U.S. PATENT DOCUMENTS 4,520,305 A * 5/1985 Cauchy ...................... 322/2 R
6,347,521 B1 * 2/2002 Kadotani et al. ............... 62/3.7

FOREIGN PATENT DOCUMENTS

JP    2004-014995    1/2004
JP    2004-301873    10/2004

OTHER PUBLICATIONS

Evaluation of Thermal Expansion Coefficient of Twinned YBa2Cu3O7 Film for Prediction of Crack Formation on Various Substrates ( Japanese Journal of Applied Physics).*

* cited by examiner

*Primary Examiner*—William E Tapolcai
(74) *Attorney, Agent, or Firm*—Oblon, Spivak, McClelland, Maier & Neustadt, P.C.

(57) ABSTRACT

A thermoelectric conversion module includes a first insulated substrate formed in a plate shape, a second insulated substrate formed in a plate shape, the first insulated substrate and the second insulated substrate are provided so as to be paired, plural thermoelectric elements provided between the insulated substrates so as to be joined thereto, a first object joined to the first insulated substrate in a manner where the first object is cooled and a second object joined to the second insulated substrate in a manner where the second object is heated, wherein a thickness of the first insulated substrate is set on the basis of a linear expansion of the first object, and a thickness of the second insulated substrates is set on the basis of a linear expansion of the second object.

14 Claims, 2 Drawing Sheets

THERMOELECTRIC CONVERSION MODULE AND ELECTRONIC DEVICE

CROSS REFERENCE TO RELATED APPLICATIONS

This application is based on and claims priority under 35 U.S.C. § 119 to Japanese Patent Application 2005-090020, filed on Mar. 25, 2005, the entire content of which is incorporated herein by reference.

FIELD OF THE INVENTION

The present invention relates to a thermoelectric conversion module and an electronic device to which the thermoelectric conversion module is mounted.

BACKGROUND

A known optical device such as an optical communication laser diode (LD) module includes a thermoelectric conversion module for controlling the temperature of the optical device such as a laser diode, a package (housing) for keeping its airtightness and a mount to which the optical device is mounted.

The thermoelectric conversion module disclosed in JP2004-301873A is fixed in the package, and the mount, to which the optical device is mounted, is fixed on an upper surface of the thermoelectric conversion module.

The mount is made of a copper-tungsten alloy (Cu/W alloy) or an iron-nickel-cobalt alloy (Fe/Ni/Co alloy).

As shown in FIG. 4, another known thermoelectric conversion module, which is disclosed in JP2004-014995A, includes two insulated substrates, each of which has same thickness, and plural thermoelectric element (a P-type thermoelectric element and a T-type thermoelectric element) are provided between the two insulated substrates so as to be aligned on the counter surfaces and sandwiched therebetween. Specifically, the thermoelectric elements are soldered to electrodes, which are formed on each counter surface of the insulated substrates. The insulated substrate is made of alumina.

Generally, when the laser diode is mounted on the mount as an optical device, the temperature of the laser diode is increased because of a laser emission. In order to reduce the temperature of the optical device, a direct-current electricity is applied to the thermoelectric conversion module in a manner where the insulated substrate to which the mount is jointed is set as a cooling-side, and the insulated substrate which is joined to a bottom portion of the package is set as a cooling-side.

Then, the insulated substrate on the cooling-side and the mount shrink due to the reduction of their temperatures, and the insulated substrate on the heat dissipating-side and package expand due to the increment of their temperature. Because of such shrinking or expanding, stress is applied to the thermoelectric elements, which are provided between both insulated substrates so as to be soldered to each of the insulated substrates.

The level of stress varies depending on a material of the member that is joined to each of the insulated substrates such as the mount and the bottom portion of the package. Specifically, when the mount is made of Fe/Ni/Co alloy and the bottom proportion (bottom plate) is made of Cu20/W80 alloy, larger stress is applied to the thermoelectric conversion. In other words, the larger the difference between the linear expansion coefficient of the mount and the liner expansion coefficient of the bottom portion of the base portion of the package become, the more the thermoelectric conversion module is stressed. Thus, a crack or a separation occur on the joint portions between the thermoelectric element and each of the mount and the base portion of the package, as a result, a level of the cooling ability has been reduced.

A need thus exists to provide a thermoelectric conversion module and an electronic device to which the thermoelectric conversion module is mounted which reduce the level of stress applied to the thermoelectric element.

SUMMARY OF THE INVENTION

According to an aspect of the present invention, a thermoelectric conversion module includes a first insulated substrate formed in a plate shape, a second insulated substrate formed in a plate shape, the first insulated substrate and the second insulated substrate are provided so as to be paired, plural thermoelectric elements provided between the insulated substrates so as to be joined thereto, a first object joined to the first insulated substrate in a manner where the first object is cooled and a second object joined to the second insulated substrate in a manner where the second object is heated, wherein a thickness of the first insulated substrate is set on the basis of a linear expansion of the first object, and a thickness of the second insulated substrates is set on the basis of a linear expansion of the second object.

According to another aspect of the present invention, an electronic device includes a package including a bottom plate, a mount to which an element, which needs to be controlled in its temperature, is mounted, a first insulated substrate joined to the mount, a second insulated substrate joined to the bottom plate of the package, plural thermoelectric elements provided between the first insulated substrate and the second insulated substrate so as to be joined thereto in order to cool the mount and to emit heat to the bottom plate of the package while power applied, wherein a thickness of the first insulated substrate is set on the basis of a linear expansion of the mount, and a thickness of the second insulated substrate is set on the basis of a linear expansion of the bottom plate of the package.

BRIEF DESCRIPTION OF THE DRAWINGS

The foregoing and additional features and characteristics of the present invention will become more apparent from the following detailed description considered with reference to the accompanying drawings, wherein.

DETAILED DESCRIPTION

First Embodiment

Figure 1A:
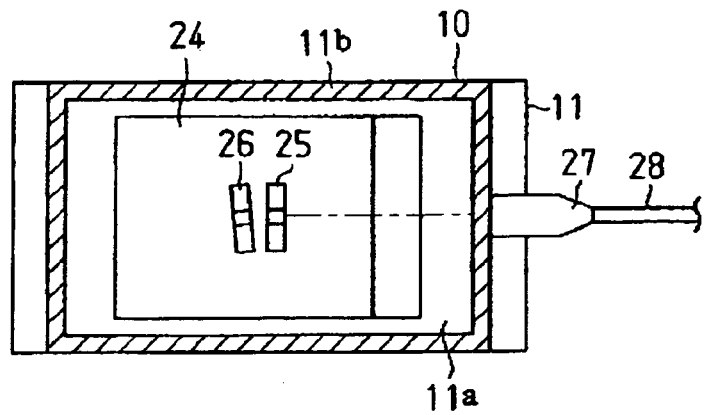
FIG. 1A illustrates a flat view indicating an optical device.
Figure 1B:
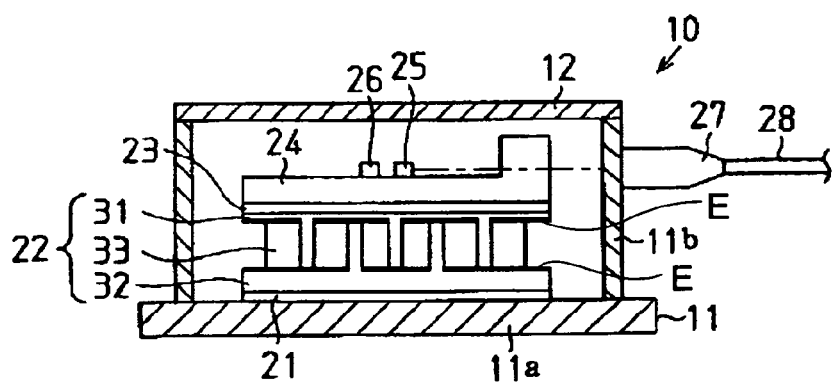
FIG. 1B illustrates a longitudinal sectional view indicating the optical device.

A first embodiment of the present invention will be explained in accordance with the attached drawings. As shown in FIG. 1A and FIG. 1B, an optical device 10 serving as an electronic device includes a package 11 and a cap 12.

Specifically, the package 11 is configured of a base plate 11a serving as a second object, which is formed in a rectangular plate shape having a predetermined thickness, and a side wall portion 11b, which is formed in a rectangular tube shape and provided on an upper surface of the base plate 11a.

More specifically, the side wall portion 11b has an opening so as to open upward, and the opening of the side wall portion 11b is covered by the cap in a manner where it is joined to an upper end of the side wall portion 11b. The space enclosed by the package 11 and the cap 12 is filled with nitrogen gas.

On the upper surface of the base plate 11a, a thermoelectric conversion module 22 is joined by means of a solder 21. Further, on an upper surface of the thermoelectric conversion module 22, a mount 24 serving as a first object is joined by means of a solder 23. Furthermore, on the upper surface of the mount 24, a laser diode (LD) 25 and a photodiode (PD) 26 are mounted. Specifically, the laser diode (LD) serves as an element, and the photodiode (PD) 26 is provided behind the laser diode in order to receive the laser emitted from the laser diode. Driving current is supplied to the laser diode 25 by means of a lead (not shown) provided at the side wall portion 11b in order to actuate the laser diode 25 so as to emit the laser in accordance with the driving current. An optical axis of the laser emitted by the laser diode 25 is illustrated with a dashed line in each of figures. On one side of the side wall portion 11b, toward which the laser is emitted from the laser diode 25, a fiber holder 27 is fixed. Further, an optical fiber 28 is fixed to the fiber holder 27. The laser emitted from the laser diode 28 is transmitted through a lens (not shown) into the optical fiber 28.

A driving current is supplied to the thermoelectric conversion module 22 by means of a lead (not shown) provided at the side wall portion 11b in order to cool the laser diode 25. Specifically, the driving current is supplied to the thermoelectric conversion module 22 in a manner where the upper side thereof joined to the mount 24 is set as a cooling-side, and the lower side thereof joined to the base plate 11a is set as a heat dissipating-side.

Then, the configuration of the thermoelectric conversion module 22 will be explained in detail. The thermoelectric conversion module 22 includes an insulated substrate (cooling-side insulated substrate) 31 (serving as a first insulated substrate) to which the mount 24 is joined, an insulated substrate (heat dissipating-side insulated substrate) 32 (serving as a second insulated substrate) which is joined to the base plate 11a, and plural thermoelectric elements 33 which are provided between the insulated substrate (cooling-side insulated substrate) 31 and the insulated substrate (heat dissipating-side insulated substrate) 32.

Electrodes E are formed on one surface of the cooling-side insulated substrate 31, and electrodes E are formed on one surface of the heat dissipating-side insulated substrate 32. The cooling-side insulated substrate 31 faces the heat dissipating-side insulated substrate 32 at each surface on which the electrodes are formed. Each of the plural thermoelectric elements 33 includes a P-type thermoelectric element and a N-type thermoelectric element and provided between the insulated substrate 31 and the insulated substrate 32 in a manner where the thermoelectric elements 33 are joined by means of solder to each of the electrodes so as to configure an electrical parallel circuit or an electrical series circuit.

The insulated substrate 31 and the insulated substrate 32 are made of the same material, whose linear expansion coefficient is $25*10^{-6}$/K or less. In this embodiment, the insulated substrate 31 and the insulated substrate 32 are made of alumina. The thickness of the insulated substrate 31 is set on the basis of a linear expansion coefficient of a member to which the insulated substrate 31 is joined, and the thickness of the insulated substrate 32 is set on the basis of a liner expansion coefficient of a member to which the insulated substrates 32 is joined.

In this embodiment, the mount 24 is made of an iron-nickel-cobalt alloy (Fe/Ni/Co alloy), and the base plate 11a of the package 11 is made of a copper-tungsten alloy (Cu20/W80 alloy). The mount 24 is joined to the cooling side insulated substrates 31 by means of the solder 23, which is made of bismuth-stannum (Bi/Sn), and the heat dissipating-side insulated substrate 32 is joined to the base plate 11a by means of the solder 21, which is made of stannum-silver-copper (Sn/Ag/Cu).

The linear expansion coefficient (K1) of Fe/Ni/Co alloy that configures the mount 24 is ($5.3*10^{-6}$/K), and the linear expansion coefficient (K2) of Cu20/W80 alloy that configures the base plate 11a is ($8.3*10^{-6}$/K). The linear expansion coefficient (K3) of alumina that configures each of the insulated substrate 31 and the insulated substrate 32 is ($7.2*10^{-6}$/K). Thus, relationships between the linear expansion coefficients K1, K2 and K3 is represented by (K2>K3>K1).

Thus, the volume change rate such as expanding and shrinking of the base plate 11a of the package 11 is higher than that of the heat dissipating-side insulated substrate 32, and the volume change rate such as expanding and shrinking of the cooling-side insulated substrate 31 is higher than that of the mount 24.

The thicknesses of the insulated substrates 31 and 32 are set in accordance with each linear expansion coefficient of the mount 24, the base plate 11a, the insulated substrate 31 and the insulated substrate 32 in a manner where the rate of expanding and shrinking becomes low.

For example, according to the known thermoelectric conversion module, a thickness of the insulated substrate on each of the cooling-side and the heat dissipating-side is set to 0.3 mm, on the other hand, in this embodiment, a thickness of the cooling-side insulated substrate 31 is set to 0.2 mm and a thickness of the heat dissipating-side insulated substrate 32 is set to 0.4 mm.

Figure 2:
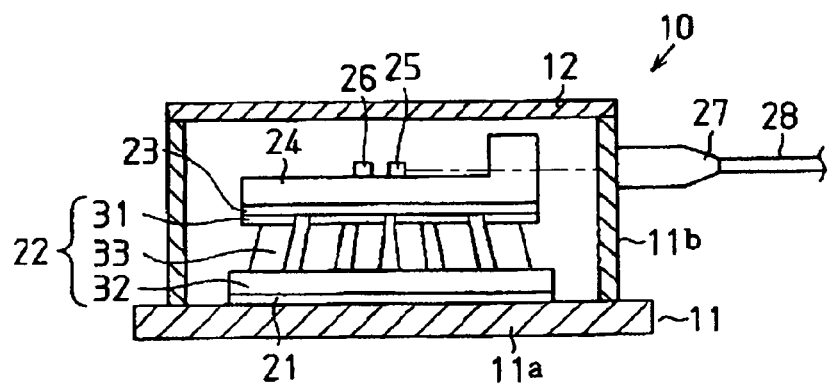
FIG. 2 illustrates a longitudinal sectional view indicating the optical device while power is supplied to a thermoelectric conversion module.

When power is supplied to the thermoelectric conversion module, as shown in FIG. 2, each of the cooling-side insulated substrate 31 and the mount 24 shrinks, and each of the heat dissipating-side insulated substrate 32 and the base plate 11a expands.

At this point, rigidity of the cooling-side insulated substrate 31 of this embodiment is lower than rigidity of the insulated substrate on the cooling-side of the known thermoelectric conversion module.

Thus, the amount of shrinking of the cooling-side insulated substrate 31 in a manner where the cooling-side insulated substrate 31 pulls the mount 24 is reduced, in other words, the mount 24 reduces the shrinking amount of the cooling-side insulated substrate 31.

On the other hand, rigidity of the heat dissipating-side insulated substrate 32 of this embodiment is higher than rigidity of the insulated substrate on the heat dissipating-side of the known thermoelectric conversion module. Thus, the expanding amount of the heat dissipating-side insulated substrate 32 by means of the base plate 11a is reduced.

Specifically, the shrinking amount of the cooling-side insulated substrate 31 is smaller than the shrinking amount of the insulated substrate of the known thermoelectric conversion module. On the other hands, the expanding amount of the heat dissipating-side insulated substrate 32 is smaller than the shrinking amount of the insulated substrates of the known thermoelectric conversion module.

Thus, stress applied to the thermoelectric elements 33, which are joined to the insulated substrate 31 and the insulated substrate 32, becomes smaller than stress applied to the known thermoelectric conversion module.

The abovementioned materials used of the mount 24, the base plate 11a, the insulated substrate 31 and the insulated substrates 32, and the thicknesses of the insulated substrates 31 and 32 are not limited to the above examples and may be changed as indicated in the following table.

TABLE 1

| | Insulated substrate | | Package base | Mount |
|---|---|---|---|---|
| | Material (linear expansion coefficient) | Cooling side | Heat dissipating side | plate material (linear expansion coefficient) | material (linear expansion coefficient) |
| 1 | alumina ($7.2*10^{-6}$/K) | 0.2 mm | 0.4 mm | Cu20/W80 ($8.3*10^{-6}$/K) | Fe/Ni/Co alloy ($5.3*10^{-6}$/K) |
| 2 | | 0.25 mm | 0.35 mm | | Cu10/W90 ($6.4*10^{-6}$/K) |
| 3 | | 0.15 mm | 0.45 mm | | aluminium nitride ($4.5*10^{-6}$/K) |
| 4 | | Any combination of above thickness | | alumina ($7.2*10^{-6}$/K) | Fe/Ni/Co alloy ($5.3*10^{-6}$/K) |
| 5 | | | | Cu20/W80 ($8.3*10^{-6}$/K) | alumina ($7.2*10^{-6}$/K) |
| 6 | aluminium nitride ($4.5*10^{-6}$/K) | | | Cu20/W80 ($8.3*10^{-6}$/K) | silicon carbide ($3.7*10^{-6}$/K) |
| 7 | | | | aluminium nitride ($4.5*10^{-6}$/K) | silicon carbide ($3.7*10^{-6}$/K) |
| 8 | | | | Cu10/W90 ($6.4*10^{-6}$/K) | aluminium nitride ($4.5*10^{-6}$/K) |

Another material such as silicon nitride or silicon carbide may be used for the insulated substrate.

According to the above mentioned thermoelectric conversion module 22, the insulated substrate 31 and the insulated substrate 32 are joined to the thermoelectric element 33 by means of a solder of stannum-antimony (Sn/Sb5) (melting point 232 degree Celsius) or silver-stannum (Au80/Sn20) (melting point 280 degree Celsius), whose melting points are 200 degree Celsius or greater.

These stannum-antimony solder and silver-stannum solder do not include lead (Pb), which is a material that put stress on environment and be used for known solders, however, the stannum-antimony solder and the silver-stannum solder according to this embodiment has a melting point, which is higher than that of the known stannum-lead (Sn/Pb) solder (melting point is 183 degree Celsius).

Because the thermoelectric element is heated to a higher temperature than that of the known thermoelectric conversion module, when the thermoelectric conversion module is configured as the known thermoelectric conversion module, durability may be reduced. Thus, according to the thermoelectric conversion module of this embodiment, because stress caused by shrinking and expanding during the power is supplied, the level of the reduction of durability may be reduced.

According to the first embodiment, when power is supplied to the thermoelectric conversion module 22, the heat dissipating-side insulated substrate 32 and the base plate 11a expand due to the emitted heat. On the other hand, the cooling-side insulated substrate 31 and the mount 24 shrink due to the cooling.

In the first embodiment, because the thickness of the heat dissipating-side insulated substrate 32 is set to be larger than that of the cooling-side insulated substrate 31, rigidity of the heat dissipating-side insulated substrate 32 is increased. Thus, the level of the expansion of the base plate 11a, which is joined to the insulated substrate 32, can be reduced, and then the rigidity of the cooling-side insulated substrate 31 becomes small, as a result, the revel of the shrinking of the insulated substrate 31 can be reduced.

Accordingly, the level stress applied to the thermoelectric elements 33, which is provided between the pair of the insulated substrate 31 and the insulated substrate 32 so as to be joined theretogether, can be reduced.

Second Embodiment

A second embodiment of the present invention will be explained in accordance with the attached drawings. Same numerals as the first embodiment is applied to the same parts in the second embodiment, and specific explanation of these parts will be skipped here.

Figure 3:
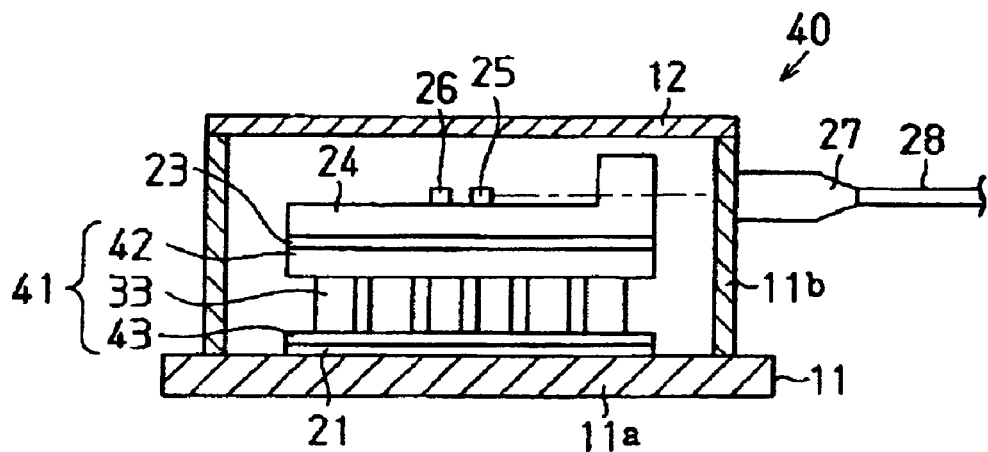
FIG. 3 illustrates a longitudinal sectional view indicating the optical device.
Figure 4:
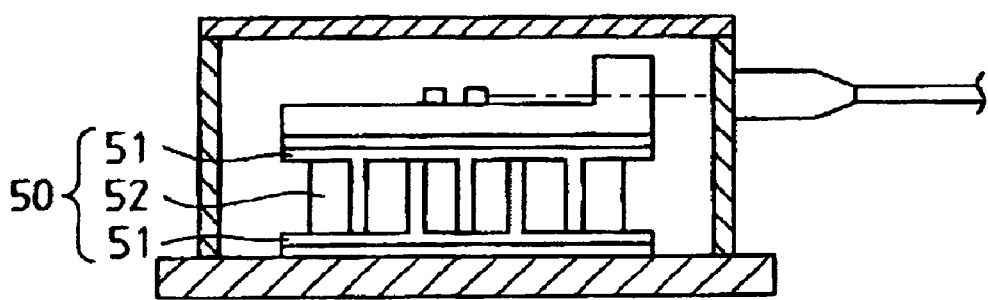
FIG. 4 illustrates a longitudinal sectional view indicating a known optical device.

As shown in FIG. 3, an optical device 40 in the second embodiment includes a thermoelectric conversion module 41. The structure of the thermoelectric conversion module is same as that of the first embodiment. Specifically, the thermoelectric conversion module 41 includes an insulated substrate (cooling-side insulated substrate) 42 (serving as a first insulated substrate) to which the mount 24 is joined, an insulated substrate (heat dissipating-side insulated substrate) 43 (serving as a second insulated substrate), which is joined to the base plate 11a, and plural thermoelectric elements 33 which are provided between the insulated substrate (cooling-side insulated substrate) 42 and the insulated substrate (heat dissipating-side insulated substrate) 43.

The insulated substrate 42 and the insulated substrate 43 are made of the same material. In this embodiment, the insulated substrate 42 and the insulated substrate 43 are made of alumina. The thickness of the insulated substrate 42 is set on the basis of a linear expansion coefficient of a member, to which the insulated substrate 42 is joined, and the thickness of the insulated substrate 43 is set on the basis of a liner expansion coefficient of a member, to which the insulated substrates 43 is joined.

Further, in this embodiment, the mount 24 is made of a copper-tungsten alloy (Cu20/W80 alloy), and the base plate 11a of the package 11 is made of an iron-nickel-cobalt alloy (Fe/Ni/Co alloy). In other words, the base plate 11a are made of materials whose linear expansion coefficient is smaller than that of the mount 24.

The linear expansion coefficient (K1) of Cu20/W80 alloy that configures the mount 24 is ($8.3*10^{-6}$/K), and the linear expansion coefficient (K2) of Fe/Ni/Co alloy that configures the base plate 11a is ($5.3*10^{-6}$/K). The linear expansion coefficient (K3) of alumina that configures each of the insulated substrate 42 and the insulated substrate 43 is ($7.2*10^{-6}$/K). Thus, relationships between the linear expansion coefficients K1, K2 and K3 is represented by (K2>K3>K1). Thus, the volume change rate such as expanding and shrinking of the base plate 11a of the package 11 is higher than that of the heat dissipating-side insulated substrate 43, and the volume change rate such as expanding and shrinking of the cooling-side insulated substrate 42 is higher than that of mount 24.

The thickness of the insulated substrates 42 and 43 are set in accordance to each linear expansion coefficient of the mount 24, the base plate 11a, the insulated substrate 42 and the insulated substrate 43 in a manner where the rate of expanding and shrinking is low. For example, in this embodiment, a thickness of the cooling-side insulated substrate 42 is set to 0.4 mm and a thickness of the heat dissipating-side insulated substrate 43 is set to 0.2 mm.

When the power is supplied to the thermoelectric conversion module, the cooling-side insulated substrate 42 and the mount 24 shrink, and the heat dissipating-side insulated substrate 43 and the base plate 11a expand. At this point, rigidity of the cooling-side insulated substrate 42 of this embodiment is higher than rigidity of the insulated substrate on the cooling-side of the known thermoelectric conversion module. Thus, the amount of shrinking of mount 24 in a manner where the mount 24 pulls the cooling-side insulated substrate 42 is reduced.

On the other hand, rigidity of the heat dissipating-side insulated substrate 43 of this embodiment is lower than rigidity of the insulated substrate on the heat dissipating-side of the known thermoelectric conversion module.

Thus, the expanding amount of the heat dissipating-side insulated substrate 43 by means of the base plate 11a is reduced.

Specifically, the shrinking amount of the cooling-side insulated substrate 42 is smaller than the shrinking amount of the insulated substrate of the known thermoelectric conversion module. On the other hands, the expanding amount of the heat dissipating-side insulated substrate 43 is smaller than the expanding amount of the insulated substrates of the known thermoelectric conversion module. Thus, stress applied to the thermoelectric elements 33, which are joined to the insulated substrate 42 and the insulated substrate 43, becomes smaller than stress applied to the known thermoelectric conversion module.

The abovementioned materials of the mount 24, the base plate 11a, the insulated substrate 42 and the insulated substrates 43, and the thicknesses of the insulated substrates 42 and 43 are not limited to the above examples and may be changed as indicated in the following table.

dissipating-side insulated substrate 43 and the base plate 11a expand due to the emitted heat. On the other hand, the cooling-side insulated substrate 42 and the mount 24 shrink due to the cooling.

Because the thickness of the heat dissipating-side insulated substrate 43 is set to be smaller than that of the cooling-side insulated substrate 42, rigidity of the heat dissipating-side insulated substrate 43 is decreased.

Thus, the level of the expansion of the insulated substrate 43 can be reduced, and then the rigidity of the cooling-side insulated substrate 42 becomes large, as a result, the revel of the shrinking of the mount 24 can be reduced.

Accordingly, the level stress applied to the thermoelectric elements 33, which is provided between the pair of the insulated substrate 42 and the insulated substrate 43 so as to be joined theretogether, can be reduced.

The above mentioned embodiments may be modified as follow.

In the above embodiments, optical devices 10 and 40 include the LD 25 mounted on the mount 24, however, this invention can be applied to another device unless it has a part that needs to be controlled in terms of temperature. For example, this invention may be applied to a device, which includes a semiconductor amplifier, a modulator and a receive element. Further, in the above embodiments, the thermoelectric conversion module is used for controlling the temperature, however, it may be uses for controlling voltage. Specifically, this invention may be applied to the device in which the insulated substrate is joined to another member by means of a bonding material such as a solder or an adhesive agent.

In both above embodiments, a total of the thickness of the cooling-side insulated substrates 31 and the thickness of the dissipating-side insulated substrate 32 is set to be 0.6 mm. This is regulated by the package 11 on which the thermoelectric conversion module 22 is mounted.

Specifically, because laser is emitted from LD 25 toward the optical fiber 28, a distance between the upper surface of the base plate 11a and the LD 25 will be set on the basis of the position at which the optical fiber 28 is provided, in other

TABLE 2

| | Insulated substrate | | | Package base | |
|---|---|---|---|---|---|
| | Material (linear expansion coefficient) | Cooling side | Heat dissipating side | plate material (linear expansion coefficient) | Mount material (linear expansion coefficient) |
| 1 | alumina ($7.2*10^{-6}$/K) | 0.4 mm | 0.2 mm | Fe/Ni/Co alloy ($5.3*10^{-6}$/K) | Cu20/W80 ($8.3*10^{-6}$/K) |
| 2 | | 0.35 mm | 0.25 mm | Cu10/W90 ($6.4*10^{-6}$/K) | aluminium ($23.5*10^{-6}$/K) |
| 3 | | 0.45 mm | 0.15 mm | | Cu ($17*10^{-6}$/K) |
| 4 | | Any combination of above thickness | | alumina ($7.2*10^{-6}$/K) | Cu ($17*10^{-6}$/K) |
| 5 | | | | Cu10/W90 ($6.4*10^{-6}$/K) | alumina ($7.2*10^{-6}$/K) |
| 6 | calcium titanate ($11.5*10^{-6}$/K) | | | Cu20/W80 ($8.3*10^{-6}$/K) | aluminium ($23.5*10^{-6}$/K) |
| 7 | | | | | calcium titanate ($11.5*10^{-6}$/K) |

Another material such as silicon nitride or silicon carbide may be used for the insulated substrate.

According to the second embodiment, when power is supplied to the thermoelectric conversion module 41, the heat words, the height of the LD 25 needs to be set on the basis of the position of the optical fiber 28. The height of the thermoelectric element 33 (the distance between the insulated substrates) is set on the basis of the coolability of the LD25.

Thus, the thicknesses of the both insulated substrates may be changed unless their total is constant. The thicknesses of the insulated substrates are not limited to the values in the table 1 and the table 2.

In the above embodiments, the linear expansion coefficient of the base plate 11a of the package 11 may be identical to the liner expansion coefficient of the heat dissipating-side insulated substrate. Further, the liner expansion coefficient of the mount 24 may be identical to the liner expansion coefficient of the cooling-side insulated substrate.

The object joined to the insulated substrate shrinks or expands due to cooling and heating. Because the thickness of the insulated substrate is set on the basis of the linear expansion coefficient of the object, which is joined to the insulated substrate, rigidity of the insulated substrate according to the thickness can control the level of expanding and shrinking of the object to which the insulate substrate joined. Accordingly, stress applied to the thermoelectric element, which is provided between the pair of insulated substrates and joined thereto, can be reduced comparing to the insulated substrate whose thickness is not set on the basis of the liner expansion coefficient of the object.

The thickness of the insulated substrate on the heat dissipating-side is set so as to be greater than the thickness of the insulated substrate on the cooling-side. Thus, rigidity of the insulated substrate on the heat dissipating-side becomes high, accordingly the expansion of the object joined to the insulated substrate is reduced. On the other hand, rigidity of the insulated substrate on the cooling-side becomes low, accordingly the shrinking of the insulated substrate is reduced.

As a result, stress applied to the thermoelectric element, which is provided between the pair of insulated substrates and joined thereto, can be reduced comparing to the pair of the insulated substrates whose thicknesses are set so as to be the same.

The thickness of the insulated substrate on the heat dissipating-side is set so as to be smaller than the thickness of the insulated substrate on the cooling-side. Thus, rigidity of the insulated substrate on the heat dissipating-side becomes low, accordingly the expansion of the object joined to the insulated substrate is reduced. On the other hand, rigidity of the insulated substrate on the cooling-side becomes high, accordingly the shrinking of the insulated substrate is reduced.

As a result, stress applied to the thermoelectric element, which is provided between the pair of insulated substrates and joined thereto, can be reduced comparing to the pair of the insulated substrates whose thickness are set so as to be the same.

The insulated substrate is made of a material whose linear expansion coefficient is equal to or less than $25*10^{-6}/K$.

The plural thermoelectric elements are joined to the electrodes formed on each of the insulated substrates on their opposite surface by means of solder whose melting point is equal to or more than 200 degree Celsius.

When each thickness of the insulated substrates is same, because heat transmits to the thermoelectric element when it is soldered to each of the insulated substrates, durability of the thermoelectric elements is decreased because of stress caused by the heat and stress caused by the expanding and shrinking. However, according to the embodiment, level of stress caused by the shrinking and expanding and the deterioration of durability are reduced by setting the thicknesses of the insulated substrates so as to be different.

The base plate joined to the first insulated substrate and the mount joined to the second insulated substrate shrink or expand due to cooling and heating. Because each thickness of the insulated substrates is set on the basis of the linear expansion coefficient of the base plate or the mount, rigidity of the insulated substrate according to the thickness can control the level of expanding and shrinking of the base plate or the mount to which the insulate substrate is joined. Accordingly, stress applied to the thermoelectric element, which is provided between the pair of insulated substrates and joined thereto, can be reduced comparing to the insulated substrates whose thicknesses are set to be same.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the sprit of the present invention. Accordingly, it is expressly intended that all such variations, changes and equivalents which fall within the spirit and scope of the present invention as defined in the claims, be embraced thereby.

The invention claimed is:

1. A thermoelectric conversion module comprising:
   a first insulated substrate formed in a plate shape;
   a second insulated substrate formed in a plate shape;
   the first insulated substrate and the second insulated substrate being provided so as to be paired;
   plural thermoelectric elements provided between the first and second insulated substrates so as to be joined thereto;
   a first object joined to the first insulated substrate in a manner such that the first object is cooled; and
   a second object joined to the second insulated substrate in a manner such that the second object is heated, wherein a thickness of the first insulated substrate is set based on a linear expansion coefficient of the first object, and a thickness of the second insulated substrate is set based on a linear expansion coefficient of the second object.

2. The thermoelectric conversion module according to claim 1, wherein the thickness of the second insulated substrate is set to be larger than the thickness of the first insulated substrate.

3. The thermoelectric conversion module according to claim 1, wherein the thickness of the second insulated substrate is set to be smaller than the thickness of the first insulated substrate.

4. The thermoelectric conversion module according to claim 1, wherein each of the first insulated substrate and the second insulated substrate are made of a material that includes a linear expansion coefficient that is equal to or less than $25 \times 10^{-6}/K$.

5. The thermoelectric conversion module according to claim 1, wherein electrodes are formed on the first insulated substrate and the second insulated substrate so as to oppose each other, and the plural thermoelectric elements are joined to electrodes formed on the first insulated substrate and the the electrodes formed on the second insulated substrate by a solder that includes a melting point equal to or more than 200 degrees Celsius.

6. An electronic device comprising:
   a package including a bottom plate;
   a mount to which an element, which is to be controlled in its temperature, is mounted;
   a first insulated substrate joined to the mount;
   a second insulated substrate joined to the bottom plate of the package;
   plural thermoelectric elements provided between the first insulated substrate and the second insulated substrate so as to be joined thereto in order to cool the mount and to emit heat to the bottom plate of the package while a power is applied, wherein a thickness of the first insulated substrate is set based on a linear expansion coefficient of the mount, and a thickness of the second insulated substrate is set based on a linear expansion coefficient of the bottom plate of the package.

7. The thermoelectric conversion module according to claim 6, wherein the thickness of the second insulated substrate is set to be larger than the thickness of the first insulated substrate.

8. The thermoelectric conversion module according to claim 6, wherein the thickness of the second insulated substrate is set to be smaller than the thickness of the first insulated substrate.

9. The thermoelectric conversion module according to claim 6, wherein each of the first insulated substrate and the second insulated substrate are made of a material that includes a linear expansion coefficient that is equal to or less than $25 \times 10^{-6}$/K.

10. The thermoelectric conversion module according to claim 6, wherein electrodes are formed on the first insulated substrate and the second insulated substrate so as to oppose each other, and the plural thermoelectric elements are joined to the electrodes formed on the first insulated substrate and the electrodes formed on the second insulated substrate by a solder that includes a melting point equal to or more than 200 degrees Celsius.

11. The thermoelectric conversion module according to claim 1, wherein the linear expansion coefficient of the first object is different from the linear expansion coefficient of the second object such that the thickness of the first insulated substrate is different from the thickness of the second insulated substrate.

12. The thermoelectric conversion module according to claim 1, wherein the first insulated substrate and the second insulated substrate are formed of the same material, and wherein a rigidity of the first insulated substrate is less than a rigidity of the second insulated substrate.

13. The thermoelectric conversion module according to claim 6, wherein the linear expansion coefficient of the mount is different from the linear expansion coefficient of the package such that the thickness of the first insulated substrate is different from the thickness of the second insulated substrate.

14. The thermoelectric conversion module according to claim 6, wherein the first insulated substrate and the second insulated substrate are formed of the same material, and wherein a rigidity of the first insulated substrate is less than a rigidity of the second insulated substrate.

* * * * *